US007072221B2

United States Patent
Wang

(10) Patent No.: US 7,072,221 B2
(45) Date of Patent: Jul. 4, 2006

(54) FLASH MEMORY DEVICE AND METHOD FOR DRIVING THE SAME

(75) Inventor: Jong Hyun Wang, Cheongju-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 11/014,581

(22) Filed: Dec. 16, 2004

(65) Prior Publication Data

US 2005/0254306 A1  Nov. 17, 2005

(30) Foreign Application Priority Data

May 14, 2004  (KR) ...................... 10-2004-0034443

(51) Int. Cl.
*G11C 16/06* (2006.01)

(52) U.S. Cl. .............................. 365/185.22; 365/185.19

(58) Field of Classification Search ........... 365/185.22, 365/185.19, 185.28, 185.29
See application file for complete search history.

(56) References Cited

U.S. PATENT DOCUMENTS

| 5,467,309 | A | * | 11/1995 | Tanaka et al. | 365/185.14 |
| 6,181,605 | B1 | * | 1/2001 | Hollmer et al. | 365/185.22 |
| 6,222,779 | B1 | * | 4/2001 | Saito et al. | 365/189.09 |
| 6,292,394 | B1 | * | 9/2001 | Cohen et al. | 365/185.19 |
| 6,807,102 | B1 | * | 10/2004 | Imamiya et al. | 365/185.22 |

FOREIGN PATENT DOCUMENTS

KR  1020030063083 A  7/2003

* cited by examiner

*Primary Examiner*—Anh Phung
(74) *Attorney, Agent, or Firm*—Marshall, Gerstein & Borun LLP

(57) ABSTRACT

A flash memory device which can reduce the whole program or erase time and improve reliability by cycling, by storing a pulse width or a bias level for passing at least one bit of cells of a first page in a program or erase operation using an ISPP scheme, and using the stored pulse width or bias level as an initial pulse width or an initial bias level in a succeeding program operation or erase operation, and a method for driving the same.

4 Claims, 2 Drawing Sheets

FLASH MEMORY DEVICE AND METHOD FOR DRIVING THE SAME

BACKGROUND

1. Field of the Disclosure

The disclosure relates to a flash memory device and a method for driving the same, and more particularly to a flash memory device which can reduce a program time or erase time by varying an initial pulse width or an initial bias level in a program operation or erase operation using an Incremental Step Pulse Programming (ISPP) scheme, and a method for driving the same.

2. Discussion of Related Art

Among nonvolatile memory devices such as an Electrically Erasable and Programmable Read Only Memory (EEPROM) and a flash memory, a NOR type nonvolatile memory device which performs a data program operation by injecting electrons into a floating gate by channel hot electron injection has been widely used. The NOR type nonvolatile memory device programs data of eight memory cells at a time in byte units, namely, in parallel due to current restrictions, and thus is disadvantageous in program speed.

Recently, a NAND type flash memory device which performs a data program operation by injecting electrons into a floating gate by Fowler-Nordheim (FN) tunneling, and which provides high capacity and high integration has been suggested due to the above problems of the NOR type nonvolatile memory device. Since the NAND type flash memory device requires a small operation current in the data program operation, the NAND type flash memory device is easily provided with the current from a boosting circuit in the chip and easily operated with a single current. Accordingly, the NAND type flash memory device can perform the data program operation on memory cells connected to a selected word line in page units, namely collectively program the memory cells, thereby increasing a program speed.

In the data program operation of the NAND type flash memory device, if heterogeneity of program characteristics resulting from heterogeneity of a process is serious, a program speed difference between the memory cells connected to the selected word line increases, a repetition number of program and verify operations increases, and thus a program speed decreases. Here, heterogeneity of the program speed resulting from heterogeneity of the process generates about two orders of program time difference between the memory cells of the selected word line. Therefore, in a repetitive application method of simple program pulses having the same pulse voltage value and the same pulse time width, the program and verify operations must be performed about 100 times. In this case, the time taken to convert a voltage of the program and verify operations is much longer than a time taken to apply a program voltage, which results in a low program speed.

In order to solve the foregoing problems, the number of the program and verify operations must be restricted to about ten times. For this, the general repetitive application method of the simple program pulses needs to apply program pulses having a slightly higher pulse voltage value. However, the memory cell having the highest program speed is over-programmed, thereby increasing heterogeneity of a program threshold voltage.

So as to solve the aforementioned problems, a new program method of a NAND type flash memory device which can restrict the number of program and verify operations without increasing heterogeneity of a program threshold voltage has been disclosed in '95 ISSCC ("A 3.3V 32Mb NAND Flash Memory with ISPP Scheme), p. 128 ff. According to the ISPP scheme, when a program operation is repetitively performed, a high program voltage applied to a selected word line is set as a variable voltage value gradually increasing according to increase of a number of program operations, and a voltage applied to a bit line is set as a predetermined voltage value regardless of the number of the program operations. Therefore, when the data program operation is performed, the program voltage difference gradually increases according to the increase of the number of the program operations.

In the data program operation using the ISPP scheme, the memory cell is programmed according to increase of the number of the program operations. Even if the program threshold voltage increases, the gradually-increasing program word line voltage compensates for reduction of a potential of the floating gate. As a result, an electric field applied to a tunnel oxide film of the memory cell is always maintained constant.

However, as shown in FIGS. 1A and 1B, an initial pulse width or an initial bias level is fixedly applied to the whole pages in the program or erase operation. In case program or erase characteristics are deteriorated due to variations of the process or cycling, the threshold voltage of the cell is rarely varied in application of the initial program or erase pulse. Accordingly, the whole program or erase time increases.

SUMMARY OF THE DISCLOSURE

The disclosure is directed to a flash memory device which can reduce a program or erase time by varying an initial pulse width or an initial bias level in a program or erase operation using an ISPP scheme, and a method for driving the same.

In addition, the disclosure is directed to a flash memory device which can reduce the whole program or erase time by storing a pulse width or a bias level for passing at least one bit of cells of a first page in a program or erase operation, and using the stored pulse width or bias level as an initial pulse width or an initial bias level in a succeeding program or erase operation, and a method for driving the same.

One aspect of the disclosure is to provide a flash memory device, including: a memory cell; a pulse information register for storing pulse level or bias level information; a controller for generating a first control signal according to a program or erase command, and a second control signal according to a program state of the memory cell; a pulse counter for receiving the pulse or bias level information from the pulse information register according to the first control signal from the controller, and performing a counting operation according to the information; a pulse generator for generating a predetermined pulse by determining the pulse or bias level according to the counting signal from the pulse counter, and applying the pulse or bias information to the memory cell according to the second control signal from the controller; a sense amplifier for verifying the program state of the memory cell, and generating a pass flag when at least one bit of cells of the corresponding cells satisfy a verification level; and a logic unit for updating the pulse or bias level stored in the pulse information register, by generating an update flag by logically combining the pass flag and an initial flag notifying whether the pulse information register has an initial value.

Preferably, the flash memory device uses a bias level instead of the pulse level, and is used in an erase operation instead of the program operation.

Preferably, the flash memory device further includes an inverter for inverting the initial flag.

Preferably, the logic unit includes a NAND gate.

According to another aspect of the disclosure, a method for driving a flash memory device includes the steps of: storing a first pulse or bias level for passing at least one bit of cells of a first page in a program or erase operation as pulse information; applying the first pulse or bias level as an initial pulse or bias level in a program or erase operation of a second page; updating the pulse information by storing a second pulse level for passing at least one bit of cells of the second page; and performing a program or erase operation on a succeeding page by using the updated pulse information, and updating the pulse information by storing a pulse level for passing at least one bit of cells of a corresponding page.

Preferably, the method for driving the flash memory device uses a bias level instead of the pulse level, and is used in an erase operation instead of the program operation.

DETAILED DESCRIPTION OF PREFERRED EMBODIMENTS

A flash memory device and a method for driving the same in accordance with a preferred embodiment of the disclosure will now be described in detail with reference to the accompanying drawings.

Figure 1A:
FIGS. 1A and 1B are waveform diagrams illustrating a general pulse width and bias level for performing a program or erase operation using an ISPP scheme.
Figure 1B:
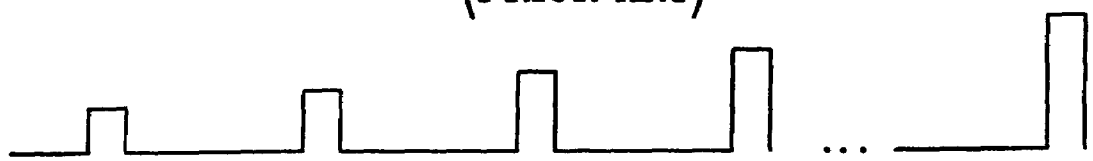
Figure 2:
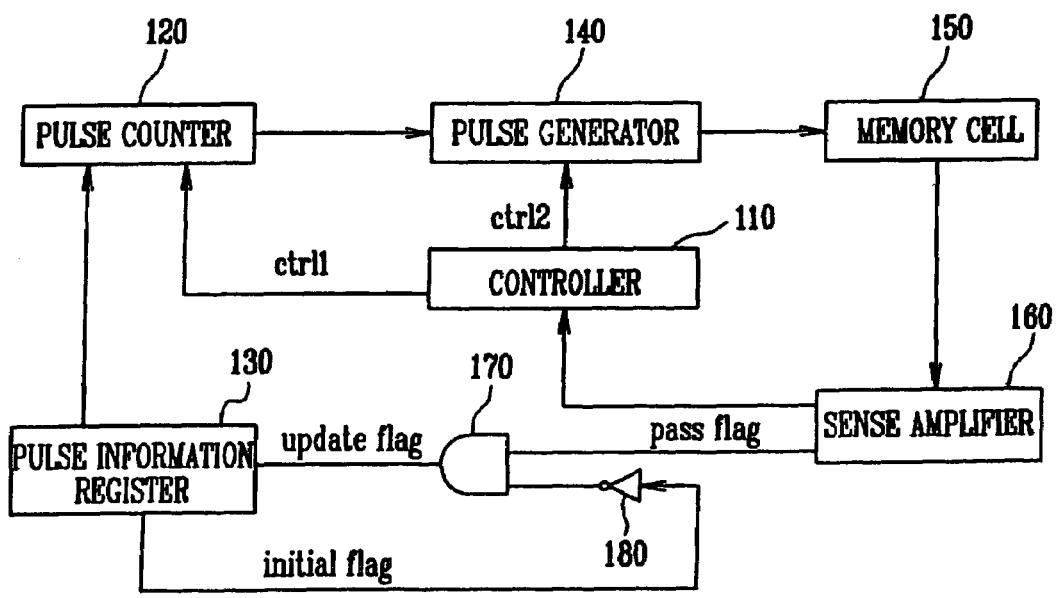
FIG. 2 is a block diagram illustrating a structure of a flash memory device in accordance with the disclosure.

FIG. 2 is a block diagram illustrating the structure of a flash memory device in accordance with the disclosure. The flash memory device can reduce the whole program or erase time, by storing a pulse width or a bias level for passing at least one bit of cells of one page in a program or erase operation using an ISPP scheme, and using the stored pulse width or bias level as an initial pulse width or an initial bias level in a succeeding program or erase operation.

A pulse information register 130 stores initial pulse width or initial bias level information. A controller 110 generates a first control signal ctrl1 according to a program or erase command, so that a pulse counter 120 can receive the initial pulse width or initial bias level information from the pulse information register 130 and perform a counting operation according to the information. A pulse generator 140 generates a pulse by determining a pulse width or a bias level according to the counting signal from the pulse counter 120. The pulse or bias generated by the pulse generator 140 is applied to a memory cell 150, for performing the program or erase operation on the memory cell 150. Application of the pulse or bias generated by the pulse generator 140 to the memory cell 150 is determined according to a second control signal ctrl2 from the controller 110. After the pulse is applied to the memory cell 150, a sense amplifier 160 senses whether characteristics of the memory cell 150 are varied to a target level. Here, when at least one bit of cells of the corresponding cells satisfy a verification level and pass, the sense amplifier 160 generates an one bit pass flag and a program or erase state signal, and inputs the program or erase state signal to the controller 110. The controller 110 generates the second control signal ctrl2 according to the state signal, to determine application of the pulse or bias generated by the pulse generator 140 to the memory cell 150. In addition, the pass flag is inputted to a NAND gate 170 with an initial flag notifying whether the pulse information register 130 inverted by an inverter 180 has an initial value. The NAND gate 170 generates an update flag by NANDing the pass flag and the initial flag. In the case that the pulse information register 130 has an initial value by the update flag, the corresponding pulse width or bias level is updated. The information is used as an initial pulse width or an initial bias level in a succeeding program or erase operation, thereby omitting an initial pulse application process which does not influence a cell state. Accordingly, the whole execution time can be reduced by programmably adjusting the initial pulse according to the program or erase characteristics of the cell.

Figure 3A:
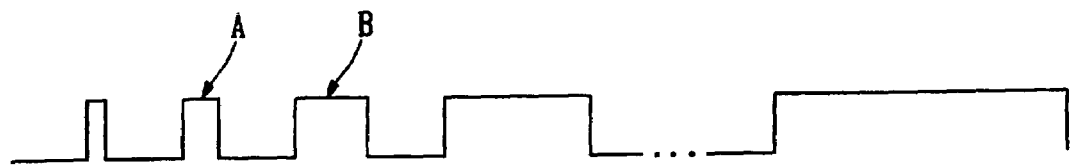
FIGS. 3A and 3B are waveform diagrams illustrating a pulse width and a bias level for performing a program or erase operation using an ISPP scheme in accordance with the disclosure.
Figure 3B:
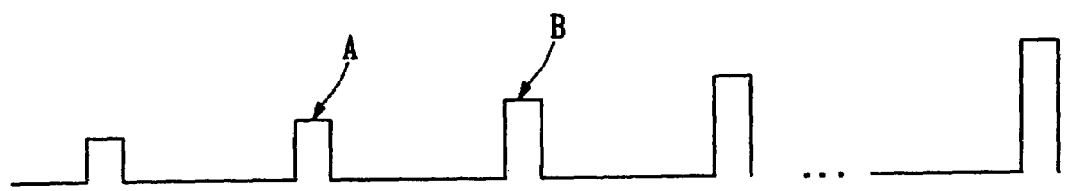

FIGS. 3A and 3B are waveform diagrams illustrating the pulse width and the bias level for performing the program or erase operation using the ISPP scheme in accordance with the present invention. When a predetermined pulse width and a predetermined bias level are applied to program or erase a NAND type flash memory device, if a pulse width and a bias level for passing a predetermined region of a memory cell, for example, at least one bit of cells of a first page are A, information of A is stored in a pulse information register. Thereafter, the pulse width and the bias level of A are applied to program or erase a second page. If a pulse width and a bias level for passing at least one bit of cells of the second page are B, information of B is stored in the pulse information register. That is, the pulse width and bias level information for passing at least one bit of cells of one page is updated in the pulse information register and used to program or erase a succeeding page.

As described above, in accordance with the disclosure, the flash memory device can reduce the whole program or erase time and improve reliability by cycling, by storing the pulse width or the bias level for passing at least one bit of cells of the first page in the program or erase operation using the ISPP scheme, and using the stored pulse width or bias level as the initial pulse width or the initial bias level in the succeeding program or erase operation.

Although the disclosure and method have been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

What is claimed is:

1. A flash memory device, comprising:
 a memory cell;
 a pulse information register for storing pulse level or bias level information;
 a controller for generating a first control signal according to a program command or erase command, and a second control signal according to a program or erase state of the memory cell;
 a pulse counter for receiving the pulse level or bias level information from the pulse information register according to the first control signal from the controller, and performing a counting operation according to the information and generating a counting signal;
 a pulse generator for generating a predetermined pulse by determining the pulse level or bias level according to the counting signal from the pulse counter, and applying the pulse to the memory cell according to the second control signal from the controller;

a sense amplifier for verifying the program state of the memory cell, and generating a pass flag when at least one bit of cells of the corresponding cells satisfy a verification level; and a logic unit for updating the pulse level or bias level stored in the pulse information register, by generating an update flag by logically combining the pass flag and an initial flag notifying whether the pulse information register has an initial value.

2. The device of claim 1, further comprising an inverter for inverting the initial flag.

3. The device of claim 1, wherein the logic unit comprises a NAND gate.

4. A method for driving a flash memory device, comprising the steps of:

storing a first pulse level or a first bias level for passing at least one bit of cells of a first page in a program operation or erase operation as pulse level or bias information;

applying the first pulse level or first bias level as an initial pulse level or initial bias level in a program operation or an erase operation of a second page;

updating the pulse information or bias information by storing a second pulse level or second bias level for passing at least one bit of cells of the second page; and performing a program operation or an erase operation on a succeeding page by using the updated pulse information or bias information, and updating the pulse information or bias information by storing a pulse level or a bias level for passing at least one bit of cells of a corresponding page.

* * * * *